(12) United States Patent
Kuo et al.

(10) Patent No.: US 11,063,086 B2
(45) Date of Patent: Jul. 13, 2021

(54) SEMICONDUCTOR DEVICES AND METHODS FOR MANUFACTURING THE SAME

(71) Applicant: InnoLux Corporation, Miao-Li County (TW)

(72) Inventors: Shu-Ming Kuo, Miao-Li County (TW); Jian-Jung Shih, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/419,101

(22) Filed: May 22, 2019

(65) Prior Publication Data

US 2019/0393263 A1 Dec. 26, 2019

Related U.S. Application Data

(60) Provisional application No. 62/687,860, filed on Jun. 21, 2018.

(30) Foreign Application Priority Data

Dec. 3, 2018 (CN) .......................... 201811464602.7

(51) Int. Cl.
*H01L 27/15* (2006.01)
*H01L 33/60* (2010.01)
*H01L 33/50* (2010.01)

(52) U.S. Cl.
CPC ............ *H01L 27/156* (2013.01); *H01L 33/50* (2013.01); *H01L 33/60* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| 2020/0083198 | A1* | 3/2020 | Kuo | ......................... H01L 33/60 |
| 2020/0152917 | A1* | 5/2020 | Kudo | ..................... H01L 27/322 |
| 2020/0258948 | A1* | 8/2020 | Seo | ....................... H01L 27/3206 |
| 2020/0259116 | A1* | 8/2020 | Chida | ....................... H01L 51/56 |

FOREIGN PATENT DOCUMENTS

| CN | 107195653 A | 9/2017 |
| CN | 107564422 A | 1/2018 |

OTHER PUBLICATIONS

Chinese language office action dated Sep. 18, 2020, issued in application No. CN 201811464602.7.

* cited by examiner

*Primary Examiner* — Long Pham
(74) *Attorney, Agent, or Firm* — McClure, Qualey & Rodack, LLP (57) ABSTRACT

A semiconductor device is provided. The semiconductor device includes a first substrate. The semiconductor device also includes a first light-emitting diode on the first substrate. The semiconductor device further includes a first insulating layer on the first substrate and adjacent to the first light-emitting diode. In addition, the semiconductor device includes an adhesive structure on the first insulating layer. The adhesive structure includes a first side facing the first light-emitting diode and a second side opposite to the first side. The semiconductor device also includes a second substrate disposed on the adhesive structure. The semiconductor device further includes an optical structure in contact with at least one of the first side and the second side.

17 Claims, 11 Drawing Sheets

SEMICONDUCTOR DEVICES AND METHODS FOR MANUFACTURING THE SAME

CROSS REFERENCE TO RELATED APPLICATIONS

This application claims priority of China Patent Application No. 201811464602.7 filed on Dec. 3, 2018, and claims priority of U.S. Patent Application No. 62/687,860 filed on Jun. 21, 2018, the entirety of which is incorporated by reference herein.

BACKGROUND

Technical Field

The present disclosure relates to a semiconductor device, and in particular to a semiconductor device including a light-emitting diode.

Description of the Related Art

Semiconductor devices have been widely used. Each generation of the semiconductor devices have been developed to be thinner, lighter, smaller, or more fashionable. In addition, the performance and/or quality of the semiconductor devices need to be improved continually. Therefore, a new semiconductor device that improves the performance and/or quality is needed.

SUMMARY

In accordance with some embodiments of the present disclosure, a semiconductor device is provided. The semiconductor device includes a first substrate. The semiconductor device also includes a first light-emitting diode on the first substrate. The semiconductor device further includes a first insulating layer on the first substrate and adjacent to the first light-emitting diode. In addition, the semiconductor device includes an adhesive structure on the first insulating layer. The adhesive structure includes a first side facing the first light-emitting diode and a second side opposite to the first side. The semiconductor device also includes a second substrate disposed on the adhesive structure. The semiconductor device further includes an optical structure in contact with least one of the first side and the second side.

In accordance with some embodiments of the present disclosure, a method of manufacturing a semiconductor device is provided. The method includes providing a first substrate and forming a first light-emitting diode on the first substrate. The method also includes forming a first insulating layer on the first substrate. The method further includes forming an adhesive structure on the first insulating layer, wherein the adhesive structure includes a first side facing the first light-emitting diode and a second side opposite to the first side. In addition, the method includes forming a second substrate on the adhesive structure. The method also includes forming an optical structure in contact with at least one of the first side and the second side.

A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein.

DETAILED DESCRIPTION

The semiconductor device of the present disclosure and the manufacturing method thereof are described in detail in the following description. In the following detailed description, for purposes of explanation, numerous specific details and embodiments are set forth in order to provide a thorough understanding of the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements. However, the use of like and/or corresponding numerals in the drawings of different embodiments does not suggest any correlation between different embodiments. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "upper" or "lower" is used to describe the position of one element relative to another. It should be appreciated that if a device is flipped upside down, an element that is on the "bottom" will become an element that is on the "top".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing. In the drawings, some components may be omitted for clarity. Moreover, some components in the drawings may be eliminated as another embodiment of the present disclosure.

The terms "about" and "substantially" typically mean+/− 20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially". Moreover, when considering the deviation or the fluctuation of the manufacturing process, the term "same" may also include the meaning of "about" or "substantially".

The term "substrate" may include elements and films that are already formed on the substrate, and may include a plurality of active elements, such as transistors. For brevity, it is illustrated in a plate substrate.

The semiconductor device may include, but is not limited to, a light-emitting device, a display device, a tiled device, a sensor device or another suitable device.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. In addition, the phrase "in a range from a first value to a second value" indicates the range includes the first value, the second value, and other values in between. In addition, the term "cover" includes the meaning of "cover partially" or "cover completely".

Figure 1:
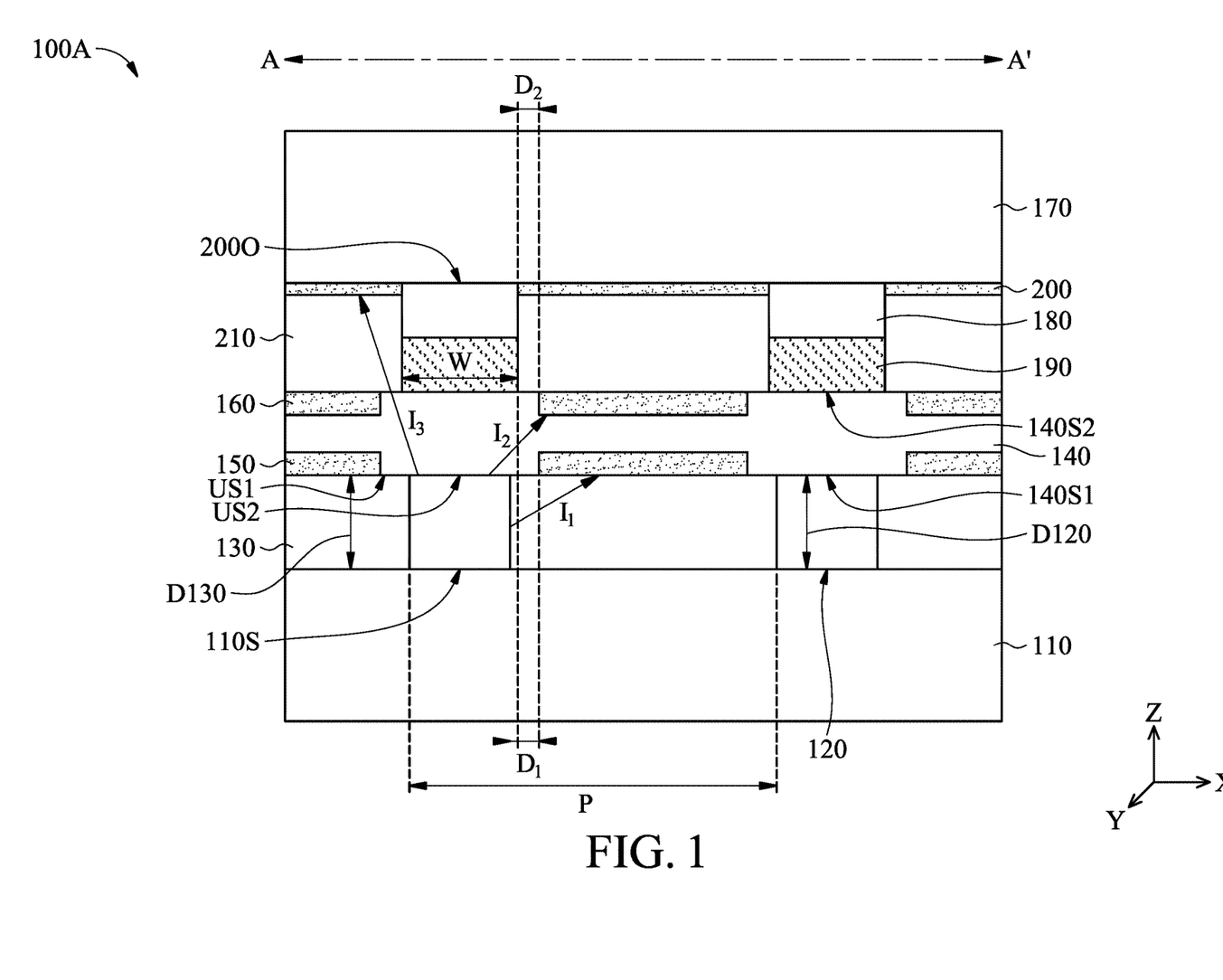
FIG. 1 illustrates a cross-sectional view of a semiconductor device in accordance with some embodiments of the present disclosure.

FIG. 1 illustrates a cross-sectional view of a semiconductor device 100A in accordance with some embodiments of the present disclosure. As shown in FIG. 1, the semiconductor device 100A may include a first substrate 110, and a plurality of light-emitting diodes 120 are disposed on the first substrate 110. The light-emitting diode 120 may be disposed on the first substrate 110 by surface-mount technology (SMT), dual in-line package (DIP) or another suitable method. In some embodiments, the material of the first substrate 110 may include, but is not limited to, glass, ceramic, plastic, sapphire or another suitable material. For example, the material of the first substrate 110 may include, but is not limited to, $SiO_2$, polyethersulphone (PES), polyacrylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (TAC), cellulose acetate propionate (CAP) or another suitable material. In some embodiments, the light-emitting diode 120 may include, but is not limited to, LED, micro LED and/or mini LED, quantum dot LED (QLED, QDLED), organic LED (OLED), phosphorescent material, fluorescent material, quantum dot material. In some embodiments, the light-emitting diode 120 may emit, but is not limited to, blue light, red light, green light, yellow light, infrared light, ultraviolet light or light of another suitable wavelength.

Figure 2:
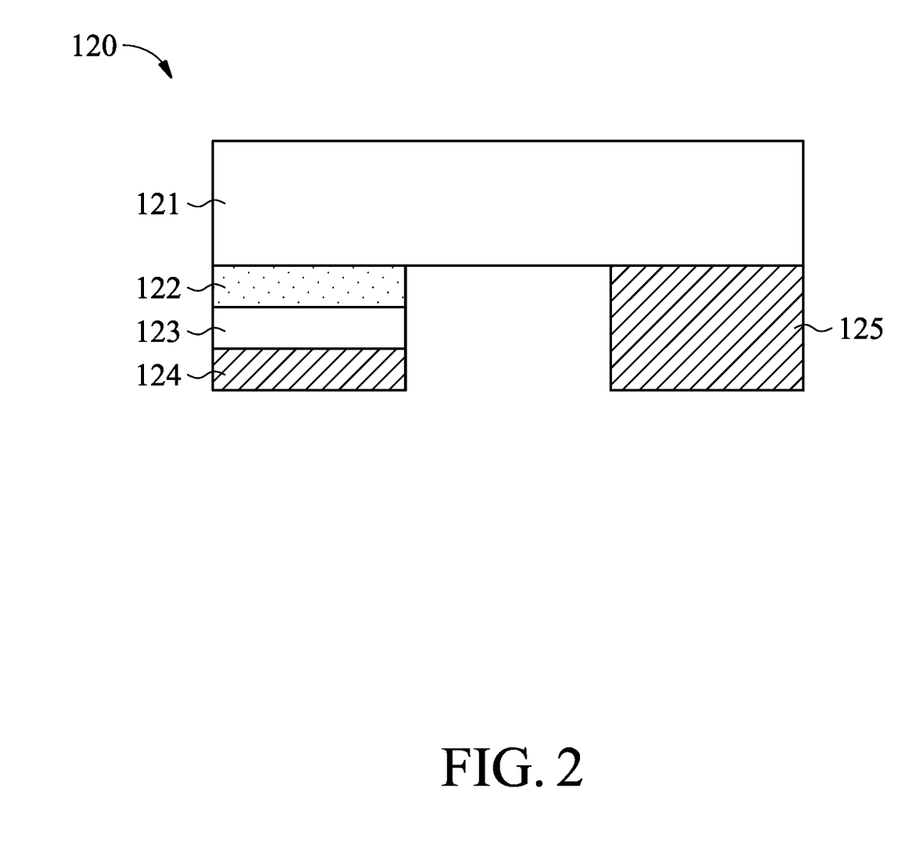
FIG. 2 illustrates a cross-sectional view of a light-emitting diode in accordance with some embodiments of the present disclosure.

FIG. 2 illustrates a cross-sectional view of the light-emitting diode 120 in accordance with some embodiments of the present disclosure. The light-emitting diode 120 may include a semiconductor layer 121, a light-emitting layer 122, a semiconductor layer 123, a conductive pad 124 and a conductive pad 125. The semiconductor layers 121 and 123 are electrically connected to the conductive pads 125 and 124, respectively. The light-emitting layer 122 is disposed between the semiconductor layers 121 and 123. It should be appreciated that the light-emitting diode 120 of FIG. 2 only illustrates a part of elements, and other structures or elements may be added. The stack structure of the light-emitting diode 120 may not be limited to FIG. 2 and may have other structures according to the species of the light-emitting diode 120. For example, the light-emitting diode 120 may include, but is not limited to, a lateral structure, a vertical structure or other species of the light-emitting diode.

As shown in FIG. 1, the semiconductor device 100A includes a first insulating layer 130, which is disposed on the first substrate 110 and adjacent to the light-emitting diodes 120. In some embodiments, the first insulating layer 130 may have a plurality of openings (not shown) in which the light-emitting diodes 120 are disposed in. That is, the light-emitting diode 120 overlaps the opening of the first insulating layer 130 in the Z direction. The Z direction is defined as the normal of the first substrate 110. In some embodiments, at least one of the light-emitting diodes 120 is disposed in one opening of the first insulating layer 130. In some embodiments, two light-emitting diodes 120 are disposed in two openings of the first insulating layer 130, and these two light-emitting diodes 120 may emit light of substantially the same waveband. However, the present disclosure is not limited thereto. The material of the first insulating layer 130 may include, but is not limited to, transparent material, white material, translucent material or another suitable material or a combination thereof. In some embodiments, the material of the first insulating layer 130 may include, but is not limited to, silicone, epoxy, poly (methyl methacrylate), polycarbonate or another suitable material or combination thereof. In some embodiments, the first insulating layer 130 may be a single-layer structure, a multi-layer structure or a composite structure. In some embodiments, the first insulating layer 130 may include, but is not limited to, light curable resin, such as UV curable resin or other wavelength curable resin, acrylic resin, moisture curable resin, optical clear adhesive (OCA), optical clear resin (OCR) or another suitable polymer.

The semiconductor device 100A may include an adhesive structure 140. The adhesive structure 140 may be disposed on the light-emitting diode 120 and the first insulating layer 130. In some embodiments, the material of the adhesive structure 140 may include, but is not limited to, transparent material. The material of the adhesive structure 140 may include, but is not limited to, OCA, OCR, light curable resin, epoxy resin, acrylic resin, moisture curable resin or another suitable material or a combination thereof. The adhesive structure 140 includes a first side 140S1 and a second side 140S2 opposite to the first side 140S1. The first side 140S1 may face the light-emitting diode 120. Namely, the first side 140S1 is a side adjacent to the light-emitting diode 120, and the second side 140S2 is a side far from the light-emitting diode 120.

In some embodiments, the semiconductor device 100A may include optical structures. The optical structure may be contact with at least one of the first side 140S1 and the second side 140S2 of the adhesive structure 140. In some embodiments, the optical structure 150 may be adjacent to the first side 140S1. In some embodiments, the optical structure 160 may be adjacent to the second side 140S2. In some embodiments, the optical structure 150 and/or the optical structure 160 may be disposed in the adhesive structure 140. In some embodiments, the material of the optical structure 150 and/or the optical structure 160 may include, but is not limited to, shielding material, absorptive material or reflective material. For example, when the optical structure 160 is absorptive material, the optical structure 150 and/or the optical structure 160 may have better than 60% or 70% absorption in the waveband of blue light. In some embodiments, when the light-emitting diodes 120 emit light of a different color or wavelength, the optical structure 150 and/or the optical structure 160 may have better than 60% or 70% absorption in the waveband emitted by the light-emitting diode 120. In some embodiments, the material of the optical structure 150 and/or the optical structure 160 may include, but is not limited to, black photoresist, black ink, black resin, white ink, a composite material whose outer surface is coated by reflective or absorptive material, or another suitable material or a combination thereof. In some embodiments, the material of the optical structure 150 and/or the optical structure 160 may include, but is not limited to, metal material, metal alloy material, metal oxide material. In some embodiments, the optical structure 150 and/or the optical structure 160 may be disposed on a portion of a top surface US1, far from the first substrate 110, of the first insulating layer 130, and there is no optical structure 150 or optical structure 160 disposed on another portion of the top surface US1 of the first insulating layer 130. In some embodiments, the optical structure 150 and/or the optical structure 160 overlaps a portion of the first insulating layer 130 in the Z direction. In some embodiments, the light-emitting diode 120 does not overlap the optical structure 150 in the Z direction. In some embodiments, the first insulating layer 130 overlaps at least a portion of the light-emitting diode 120 in the Z direction. The first insulating layer 130 may be contact with a portion of a top surface US2 of the light-emitting diode 120. In some embodiments, the distance D130, between the top surface US1 of the first insulating layer 130 and the surface 110S of the first substrate 110, may be less than or equivalent to the distance D120, between the top surface US2 of the light-emitting diode 120 and the surface 110S of the first substrate 110. The distance D130 is defined as the maximum distance between the top surface US1 of the first insulating layer 130 and the surface 110S of the first substrate 110 in the Z direction. The distance D120 is defined as the maximum distance between the top surface US2 of the light-emitting diode 120 and the surface 110S of the first substrate 110 in the Z direction. In some embodiments, the top surface US2 of the light-emitting diode 120 may be defined as, but is not limited to, the semiconductor layer 121 of FIG. 2. The definition of the top surface US2 of the light-emitting diode 120 may be different according to the species of the light-emitting diode 120, such as lateral structure, vertical structure or other structure. In some embodiments, the top surface US2 may be defined as, but is not limited to, a surface of the topmost element. In some embodiments, the top surface US2 may be defined as the surface emitting light. In some embodiments, the top surface US2 of the light-emitting diode 120 may be contact with the adhesive structure 140. In some embodiments, the adhesive structure 140 may be patterned. In some embodiments, the adhesive structure 140 may not overlap or partially overlap the light-emitting diode 120 in the Z direction.

As shown in FIG. 1, the semiconductor device 100A may include a second substrate 170, which is disposed opposite to the first substrate 110. The second substrate 170 may be disposed on the adhesive structure 140. Namely, the adhesive structure 140 is disposed between the first substrate 110 and the second substrate 170. The material of the second substrate 170 may be the same as or similar to that of the first substrate 110, and is not repeated herein.

In some embodiments, the semiconductor device 100A may include a light filter layer 180 and/or a light conversion layer 190. As shown in FIG. 1, the light filter layer 180 and/or the light conversion layer 190 may be disposed on the light-emitting diode 120. In some embodiments, the light filter layer 180 and/or the light conversion layer 190 may overlap the light-emitting diode 120 in the Z direction. In some embodiments, the light conversion layer 190 may be disposed between the second substrate 170 and the second side 140S2 of the adhesive structure 140. In some embodiments, the light conversion layer 190 may be disposed between the light-emitting diode 120 and the adhesive structure 140. In some embodiments, the light filter layer 180 may be disposed, but is not limited to, between the second substrate 170 and the light conversion layer 190. The position of the light filter layer 180 and the light conversion layer 190 may be exchanged according to the requirement. In some embodiments, the light filter layer 180 or the light conversion layer 190 may be contact with the adhesive structure 140. In some embodiments, the light filter layer 180 and/or the light conversion layer 190 may not overlap or partially overlap the optical structure 160 in the Z direction.

In some embodiments, the light conversion layer 190 is used to transform light emitted by the light-emitting diode 120 into light with other wavelength. In some embodiments, when the light-emitting diode 120 emits blue light, the light conversion layer 190 may transform it into red light, green light or light with other wavelength. The material of the light conversion layer 190 may include, but is not limited to, quantum dot, phosphorescent material, fluorescent material, a combination thereof or another suitable material or a combination thereof. The quantum dot may be made of, but is not limited to, a nano-crystal of semiconductor, and may include Zn, Cd, Se, S, InP, GaSb, GaAs or another suitable material or a combination thereof. The quantum dot may have a diameter in a range of 1 nm and 30 nm, in a range of 1 nm and 20 nm, or in a range of 1 nm and 10 nm. When the quantum dot is excited by incident light, the incident light is transformed into light with other color. In some embodiments, the quantum dot may have, but is not limited to, ball-shaped grain, rod-shaped grain or grain with another suitable shape or a combination thereof.

In some embodiments, the semiconductor device 100A may have color transformation enhancement layer (not shown). The color transformation enhancement layer may be disposed, but is not limited to, between the light filter layer 180 and the light conversion layer 190. The material of the color transformation enhancement layer may include reflective material, which is used to reflect the light that is not transformed, to the light conversion layer 190, thereby improving the efficiency of light transformation.

As shown in FIG. 1, the semiconductor device 100A may include a light shielding structure 200 and/or a second insulating layer 210. In some embodiments, the second insulating layer 210 may be disposed on the second side 140S2 of the adhesive structure 140, and adjacent to the light filter layer 180 and/or the light conversion layer 190. In some embodiments, the second insulating layer 210 may have a plurality of openings. The light filter layer 180 and/or the light conversion layer 190 may overlap the opening of the second insulating layer 210 in the Z direction. The material of the second insulating layer 210 may be the same as or similar to that of the first insulating layer 130, and is not repeated herein.

In some embodiments, the light shielding structure 200 may be disposed between the second substrate 170 and the adhesive structure 140. In some embodiments, the light shielding structure 200 may be contact with the second substrate 170. In some embodiments, the light shielding structure 200 may be disposed between the first substrate 110 and the adhesive structure 140. In some embodiments, the second insulating layer 210 may be disposed between the light shielding structure 200 and the second substrate 170. In some embodiments, the second insulating layer 210 may be disposed between the adhesive structure 140 and the second substrate 170. In some embodiments, the light filter layer 180 and/or the light conversion layer 190 may be adjacent to the light shielding structure 200. As shown in FIG. 1, the light shielding structure 200 may have a plurality of openings 2000. In some embodiments, the light filter layer 180 and/or the light conversion layer 190 may overlap the opening 2000 of the light shielding structure 200 in the Z direction. In some embodiments, the light filter layer 180 and/or the light conversion layer 190 may overlap a portion of the light shielding structure 200 in the Z direction. In some embodiments, the light shielding structure 200 may include, but is not limited to, absorptive material, shielding material, other suitable material or a combination thereof. In some embodiments, the light shielding structure 200 may be a single-layer structure, a multi-layer structure or composite structure. In some embodiments, the material of the light shielding structure 200 may include, but is not limited to, black photoresist, black ink, black resin or another suitable material or a combination thereof. The material of the light shielding structure 200 may be the same as, similar to or different from that of the optical structure 150 and/or the optical structure 160. The light shielding structure 200 may be used to absorb or shield light of the environment, thereby reducing reflection of the environment light, which passes through the semiconductor device 100A. As a result, the display or light-emitting quality is improved.

Figure 3:
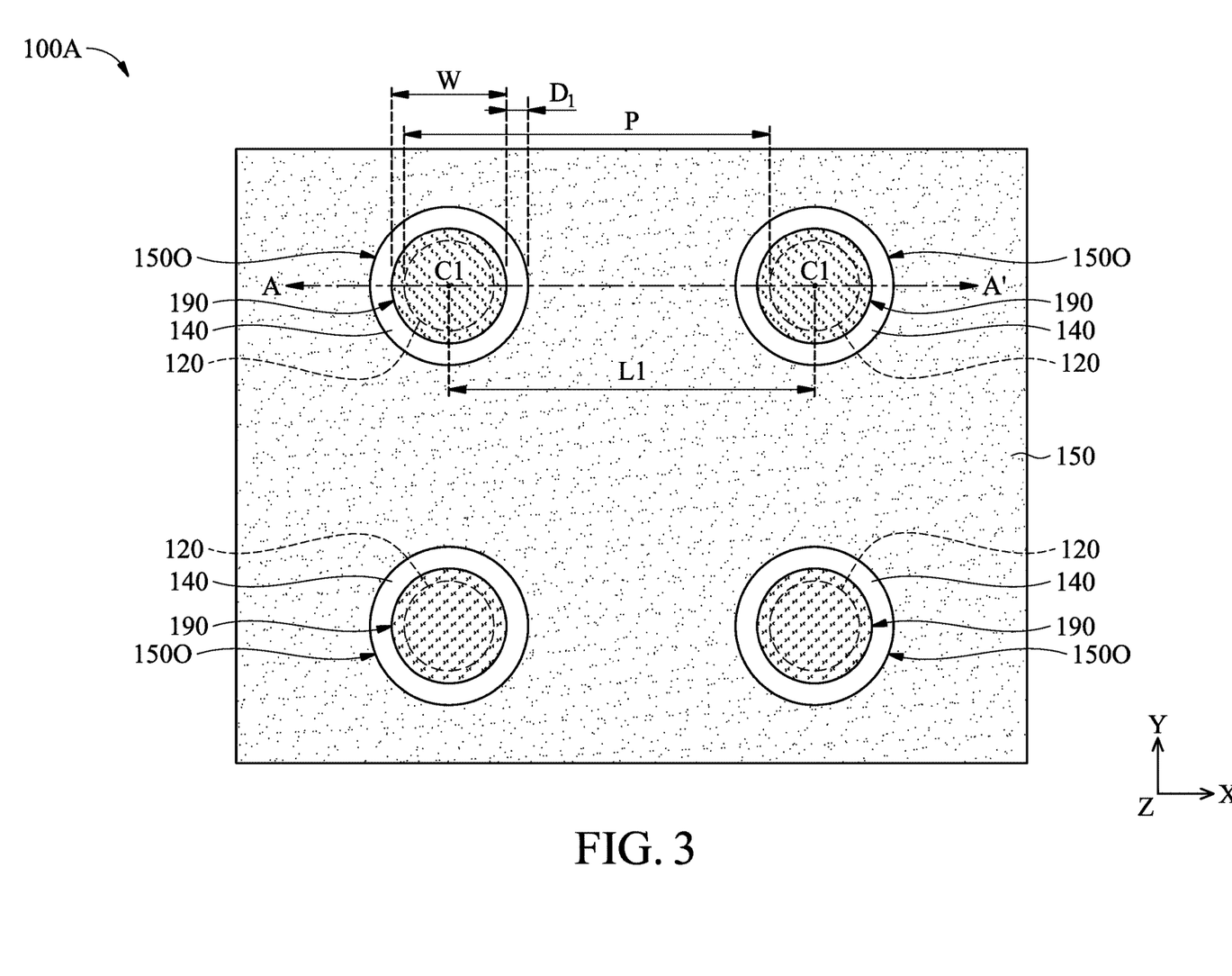
FIG. 3 illustrates a top view of the semiconductor device shown in FIG. 1 in accordance with some embodiments of the present disclosure.

FIG. 3 illustrates a top view of the semiconductor device 100A shown in FIG. 1 in accordance with some embodiments of the present disclosure. In order to clearly describe the relation of the light-emitting diode 120, the optical structure 150 and the light conversion layer 190, other elements are omitted. As shown in FIG. 3, the light-emitting diode 120 may overlap the opening 1500 of the optical structure 150 in the Z direction. Namely, the light-emitting diode 120 does not overlap the optical structure 150. In some embodiments, the profile of the opening 1500 of the optical structure 150 may include, but is not limited to, circle, rectangle, polygon or other irregular shape or a combination thereof. In some embodiments, the profile, such as the top surface US2, of the light-emitting diode 120 may include, but is not limited to, circle, rectangle, polygon or other irregular shape or a combination thereof. In some embodiments, the profile of the opening 1500 of the optical structure 150 may be the same as or different from that of the light-emitting diode 120, such as the top surface US2 of the light-emitting diode 120, in the Z direction. In some embodiments, the size of the profile of the opening 1500 of the optical structure 150 may be the same as or different from that of the light-emitting diode 120, such as the top surface US2 of the light-emitting diode 120, in the Z direction. In some embodiments, the size of the profile of the opening 1500 of the optical structure 150 may be greater than or equivalent to that of the light-emitting diode 120, such as the top surface US2 of the light-emitting diode 120 in the Z direction. In some embodiments, the size or the profile of the opening 1500 of the optical structure 150 may be smaller than or equivalent to that of the light-emitting diode 120, such as the top surface US2 of the light-emitting diode 120. In some embodiments, there is a distance $D_1$ between the optical structure 150 and the light conversion layer 190. More specifically, the distance $D_1$ may be defined as the minimum distance between the optical structure 150 and the light conversion layer 190 in the X direction. The X direction may be defined as, but is not limited to, an imaginary line that passes through two centers of adjacent two light-emitting diodes 120. The distance $D_1$ may fit the following relation (1):

$$0.5 \leq D_1 \leq ((P-W)/2)-1 \ \mu m. \tag{1}$$

The pitch P may be a pitch of two adjacent light-emitting diodes 120. For example, the pitch P may be a distance between centers C1 of two adjacent light-emitting diodes 120. Alternatively, the pitch P may be a distance between the left sides or the right sides of two adjacent light-emitting diodes 120. In addition, the width W may be a width of the light conversion layer 190. For example, when the profile of the light conversion layer 190 is substantially a circle, the width W may be defined as the diameter of the light conversion layer 190. When the profile of the light conversion layer 190 is a rectangle or an irregular shape, the width W may be defined as an extending line L1 passing through centers C1 of two adjacent light-emitting diode 120. The extending line L1 may intersect in two points of the light conversion layer 190. A maximum distance in the X direction between these two points may be defined as the width W. It should be appreciated that when the semiconductor device 100A includes the light filter layer 180 but not light conversion layer 190, the width of the equation (1) may be defined as the width of the light filter layer 180. The definition of the light filter layer 180 may be the same as or similar to that of the light conversion layer 190, and is not repeated herein.

Figure 4:
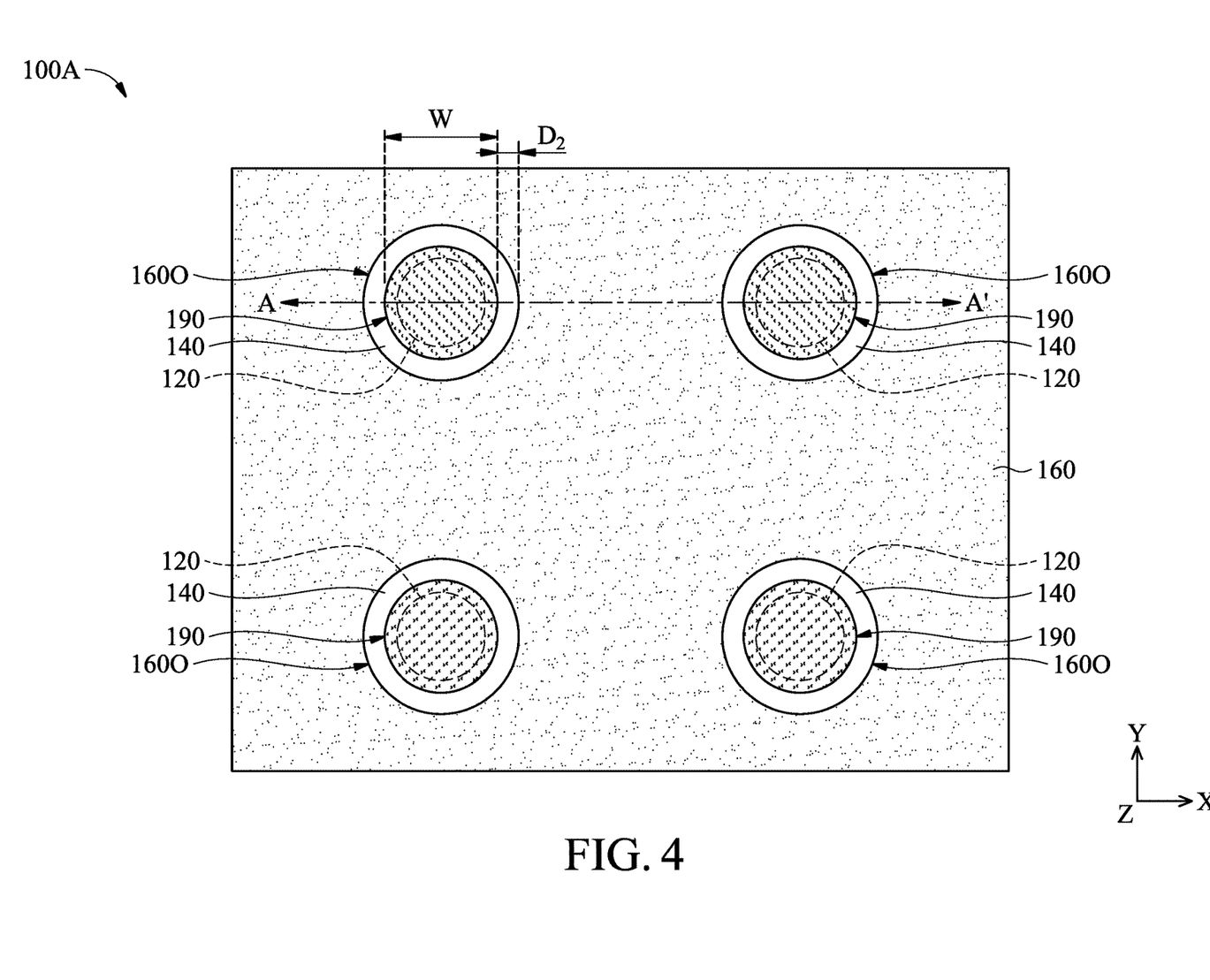
FIG. 4 illustrates a top view of the semiconductor device shown in FIG. 1 in accordance with some embodiments of the present disclosure.

FIG. 4 illustrates a top view of the semiconductor device 100A shown in FIG. 1 in accordance with some embodiments of the present disclosure. In order to clearly describe the relation of the optical structure 160 and the light conversion layer 190, other elements are omitted. In some embodiments, the profile of the opening 1600 of the optical structure 160 and the light conversion layer 190 may include, but is not limited to, circle, rectangle, polygon or other irregular shape. In some embodiments, there is a distance $D_2$ between the optical structure 160 and the light conversion layer 190. More specifically, the distance $D_2$ may be defined as the minimum distance between the optical structure 160 and the light conversion layer 190 in the X direction. The distance $D_2$ may fit the following relation (2):

$$0.5 \leq D_2 \leq ((P-W)/2)-1 \; \mu m. \tag{2}$$

When the distance $D_1$ and/or the $D_2$ fit the equation (1) or (2), the light that emitted by the light-emitting diode 120 and is incident to other light-emitting units (or pixel units) may be reduced. When the distance $D_1$ and/or the $D_2$ fit the equation (1) or (2), the light that emitted by the light-emitting diode 120 and is incident to the light filter layer 180 and/or the light conversion layer 190 of other light-emitting elements or pixel units may be reduced, which may impact the light emission or display quality. As shown in FIG. 1, side light $I_1$ emitted from the light-emitting diode 120 may be reflected or absorbed by the optical structure 150. Light $I_2$ emitted from the top surface US2 of the light-emitting diode 120 may be reflected or absorbed by the optical structure 160 and/or the optical structure 150. Light $I_3$, not transformed by the light conversion layer 190 or absorbed (or reflected) by the optical structure 160, may be absorbed by the light shielding structure 200. When the optical structure 150 and/or the optical structure 160 is disposed, and the distance, between the optical structure 150 (or the optical structure 160) and the light conversion layer 190 (or the light filter layer 180), fits the equation (1) or (2), the light emitted by the light-emitting diode 120 is not incident to other light-emitting elements or pixel units. Therefore, the interference between different light-emitting elements or pixel units may be reduced, and the display quality of the light-emitting element or pixel units of the semiconductor device 100A may be improved. In addition, the color purity of the light-emitting elements or pixel units may be enhanced. It should be appreciated that although the distance $D_1$ and/or $D_2$ is defined in the X direction. However, the present disclosure is not limited thereto. For example, the minimum distance between the optical structure 150 (or the optical structure 160) and the light conversion layer 190 (or the light filter layer 180) in the Y direction also fits the equations mentioned above. The Y direction may be orthogonal to the X and the Z direction. Similarly, the minimum distance in other direction, which is different from the X and Y direction and orthogonal to the Z direction, between the optical structure 150 (or the optical structure 160) and the light conversion layer 190 (or the light filter layer 180) also does.

Figure 5:
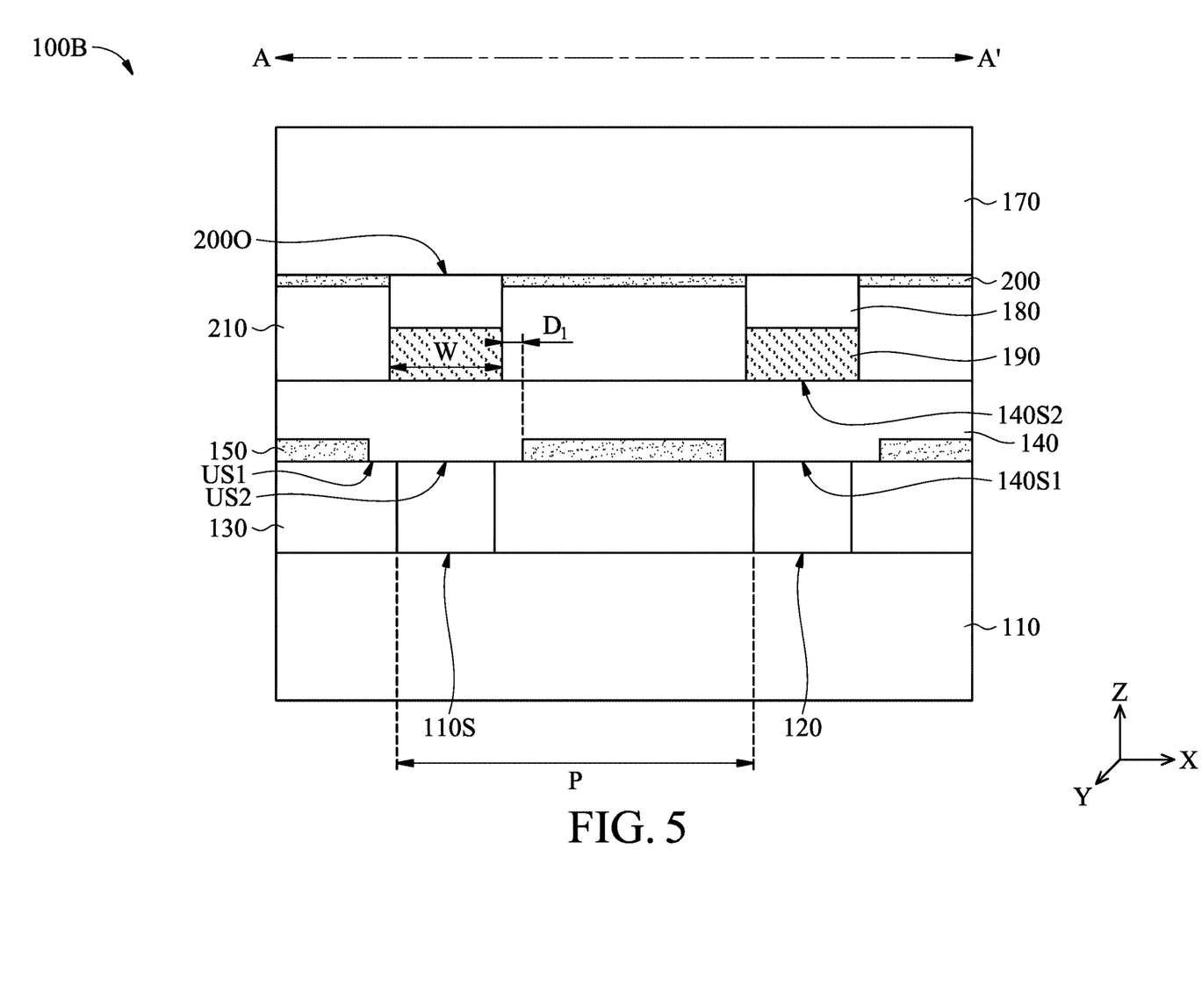
FIG. 5 illustrates a cross-sectional view of a semiconductor device in accordance with some embodiments of the present disclosure.

FIG. 5 illustrates a cross-sectional view of a semiconductor device 100B in accordance with some embodiments of the present disclosure. One of the differences between the semiconductor device 100B and the semiconductor device 100A is that the semiconductor device 100B does not include the optical structure 160. Namely, the optical structure 160 is not disposed between the second side 140S2 of the adhesive structure 140 and the second substrate 170.

Figure 6:
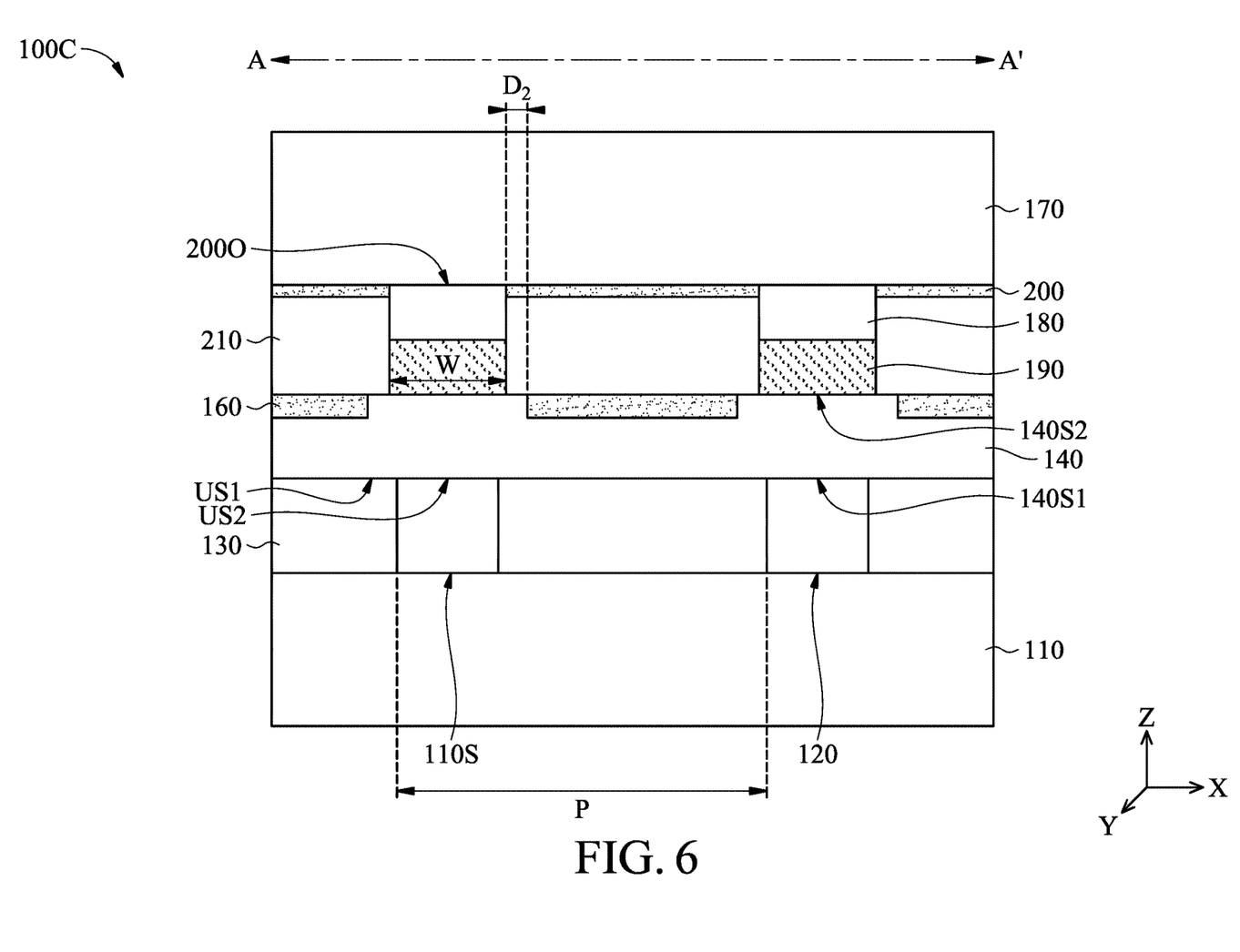
FIG. 6 illustrates a cross-sectional view of a semiconductor device in accordance with some embodiments of the present disclosure.

FIG. 6 illustrates a cross-sectional view of a semiconductor device 100C in accordance with some embodiments of the present disclosure. One of the differences between the semiconductor device 100C and the semiconductor device 100A is that the semiconductor device 100C does not include the optical structure 150. Namely, the optical structure 150 is not disposed between the first side 140S1 of the adhesive structure 140 and the first substrate 110.

Figure 7:
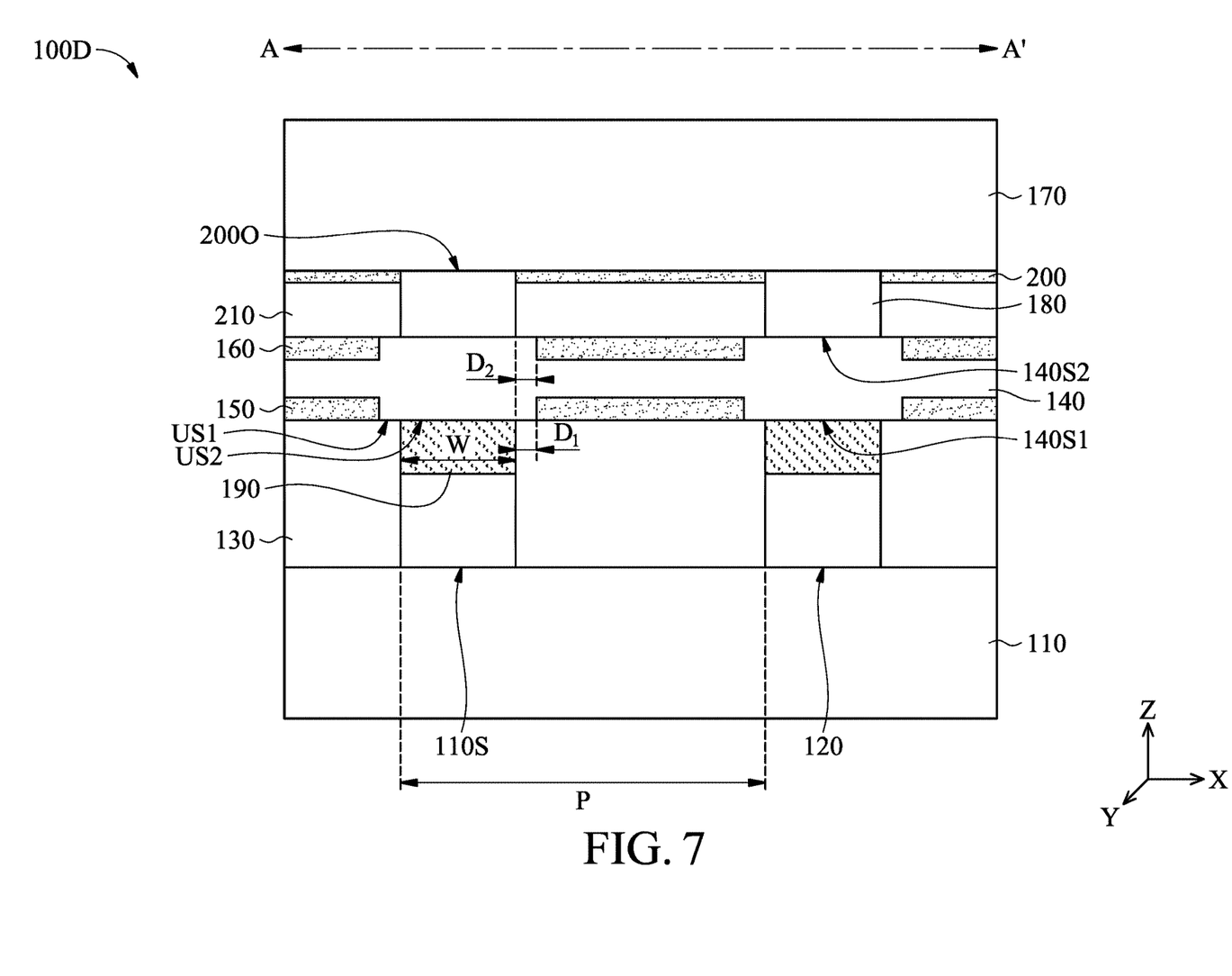
FIG. 7 illustrates a cross-sectional view of a semiconductor device in accordance with some embodiments of the present disclosure.

FIG. 7 illustrates a cross-sectional view of a semiconductor device 100D in accordance with some embodiments of the present disclosure. One of the differences between the semiconductor device 100D and the semiconductor device 100A is that the light conversion layer 190 of the semiconductor device 100D is disposed between the light-emitting diode 120 and the adhesive structure 140. In some embodiments, the adhesive structure 140 may be disposed between the light conversion layer 190 and the light filter layer 180. In some embodiments, the light conversion layer 190 may be disposed on or cover the top surface US2 of the light-emitting diode 120. The light conversion layer 190 may be contact with the light-emitting diode 120. In some embodiments, the light conversion layer 190 may be disposed on or cover the side surface (not shown) of the light-emitting diode 120. In some embodiments, the first insulating layer 130 may be adjacent to the light-emitting diode 120 and the light conversion layer 190.

Figure 8:
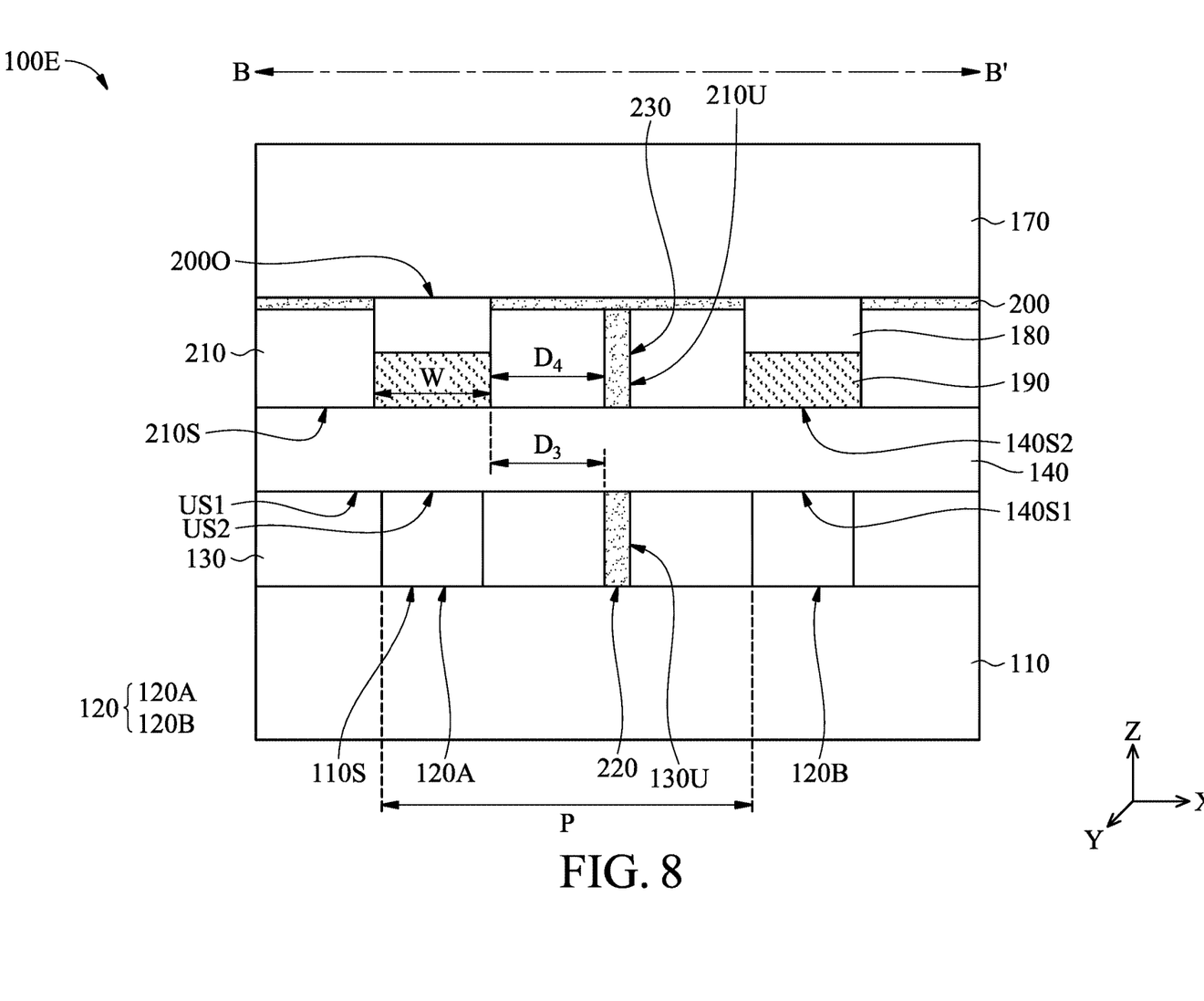
FIG. 8 illustrates a cross-sectional view of a semiconductor device in accordance with some embodiments of the present disclosure.

FIG. 8 illustrates a cross-sectional view of a semiconductor device 100E in accordance with some embodiments of the present disclosure. In some embodiments, an optical structure 220 may be disposed in the first insulating layer 130. More specifically, the first insulating layer 130 may be disposed between two adjacent light-emitting diodes, such as between the first light-emitting diode 120A and the second light-emitting diode 120B. The first insulating layer 130 has a first through hole 130U in which the optical structure 220 is disposed or filled. In some embodiments, an optical structure 230 may be disposed in the second insulating layer 210. More specifically, the second insulating layer 210 has a second through hole 210U in which the optical structure 230 is disposed or filled. In some embodiments, development and/or etching process may be performed on the first insulating layer 130 and/or the second insulating layer 210 so that the first through hole 130U and/or the second through hole 210U would be formed. In some embodiments, the material of the optical structure 220 and/or the optical structure 230 may be the same as or different from that of the optical structure 150. In some embodiments, the optical structure 230 may be contact with the light shielding structure 200. In some embodiments, a portion of the optical structure 220 may be disposed on the top surface US1 of the first insulating layer 130. In some embodiments, a portion of the optical structure 230 may be contact with the second insulating layer 210S of the second insulating layer 210.

Figure 9:
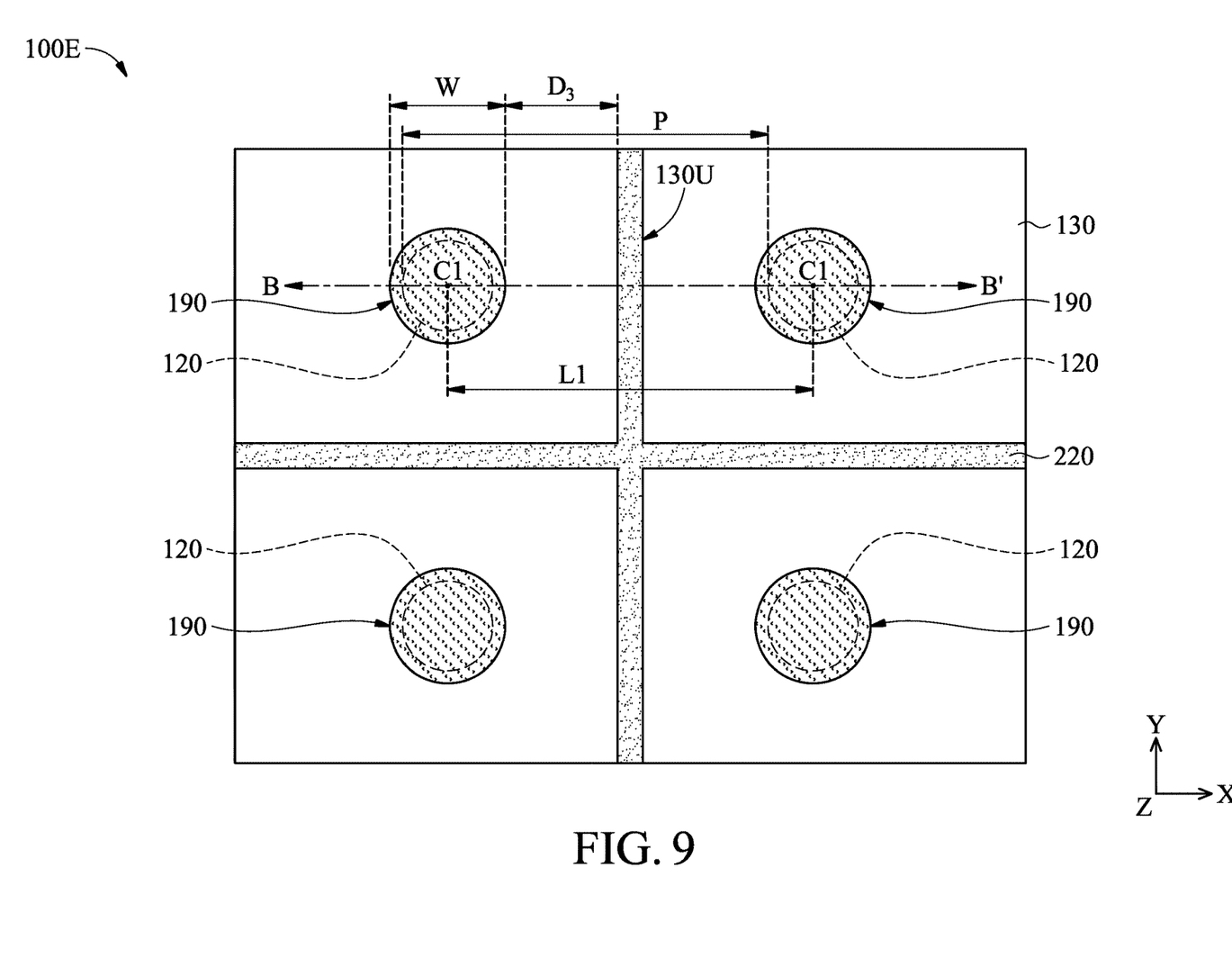
FIG. 9 illustrates a top view of the semiconductor device shown in FIG. 8 in accordance with some embodiments of the present disclosure.

FIG. 9 illustrates a top view of the semiconductor device 100E shown in FIG. 8 in accordance with some embodiments of the present disclosure. In order to clearly describe the relation of the light-emitting diode 120, the optical structure 220 and the light conversion layer 190, other elements are omitted. As shown in FIG. 9, the optical structure 220 may disposed between two adjacent light-emitting diodes 120 in the XY plane. In some embodiments, the optical structure 220 may separate the first insulating layer 130 into a plurality of sections. These sections may be adjacent to the light-emitting diode 120. In some embodiments, there is a distance $D_3$ between the light conversion layer 190 and the optical structure 220. More specifically, the distance $D_3$ may be defined as the minimum distance between the light conversion layer 190 and the optical structure 220 in the X direction. In some embodiments, the distance $D_3$ may fit the following relation (3):

$$0.5 \; \mu m \leq D_3 \leq ((P-W)/2)-1 \; \mu m. \tag{3}$$

The definition of the pitch P and the width W of the equation (3) are the same as that mentioned above.

Figure 10:
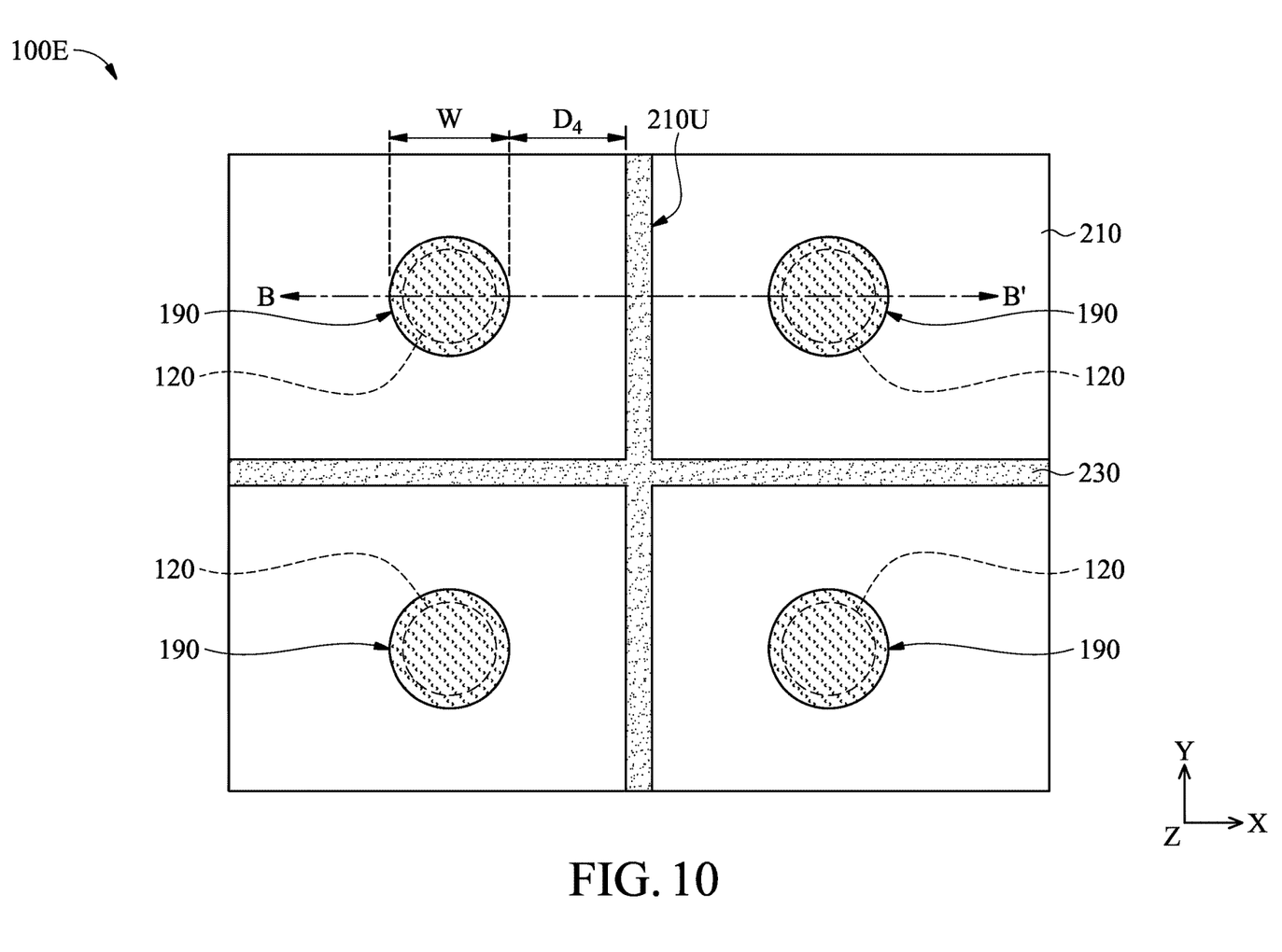
FIG. 10 illustrates a top view of the semiconductor device shown in FIG. 8 in accordance with some embodiments of the present disclosure.

FIG. 10 illustrates a top view of the semiconductor device 100E shown in FIG. 8 in accordance with some embodiments of the present disclosure. In order to clearly describe the relation of the light conversion layer 190 and the optical structure 230, other elements are omitted. As shown in FIG. 10, the optical structure 230 may be disposed between two adjacent light-emitting diodes 120 in the XY plane. In some embodiments, the optical structure 230 may separate the second insulating layer 210 into a plurality of sections. These sections may be adjacent to the light conversion layer 190. In some embodiments, there is a distance $D_4$ between the light conversion layer 190 and the optical structure 230. More specifically, the distance $D_4$ may be defined as the minimum distance between the light conversion layer 190 and the optical structure 230 in the X direction. In some embodiments, the distance $D_4$ may fit the following relation (4):

$$0.5 \ \mu m \leq D_4 \leq ((P-W)/2) - 1 \ \mu m. \quad (4)$$

The definition of the pitch P and the width W of the equation (4) are the same as that mentioned above. When the distance $D_3$ or the $D_4$ fits the equations mentioned above, light that emitted by the light-emitting diode 120 and is incident to other light-emitting elements or pixel units may be reduced, thereby improving the light emission or display quality of the semiconductor device 100E. In addition, the color purity of the light-emitting elements or pixel units of the semiconductor device 100E may be enhanced.

It should be appreciated that when the semiconductor device 100E includes the light filter layer 180 but not light conversion layer 190, the width of the equation (3) or (4) may be defined as the width of the light filter layer 180. The definition of the light filter layer 180 may be the same as or similar to that of the light conversion layer 190, and is not repeated herein.

As shown in FIGS. 8, 9 and 10, the optical structure 220 may overlap at least a portion of the optical structure 230. In some embodiments, the optical structure 220 may not overlap the optical structure 230. In some embodiments, the size or the profile of the optical structure 220 may be the same as or different from that of the optical structure 230. It should be appreciated that the optical structure 220 and the optical structure 230 of FIGS. 9 and 10 are cross-shaped. However, if the field of vision of the top view of the semiconductor device 100E is enlarged, the optical structure 220 and the optical structure 230 may have a mesh-shaped profile, which is consisted of multiple crosses. The mesh-shaped profile may have, but is not limited to, an arc-shaped edge. In some embodiments, the optical structure 220 and the optical structure 230 may have multiple disconnected patterns in the XY plane. These disconnected patterns may correspond to, but is not limited to, the outer edge of the light-emitting diode 120, the light conversion layer 190 or the light filter layer 180.

Figure 11:
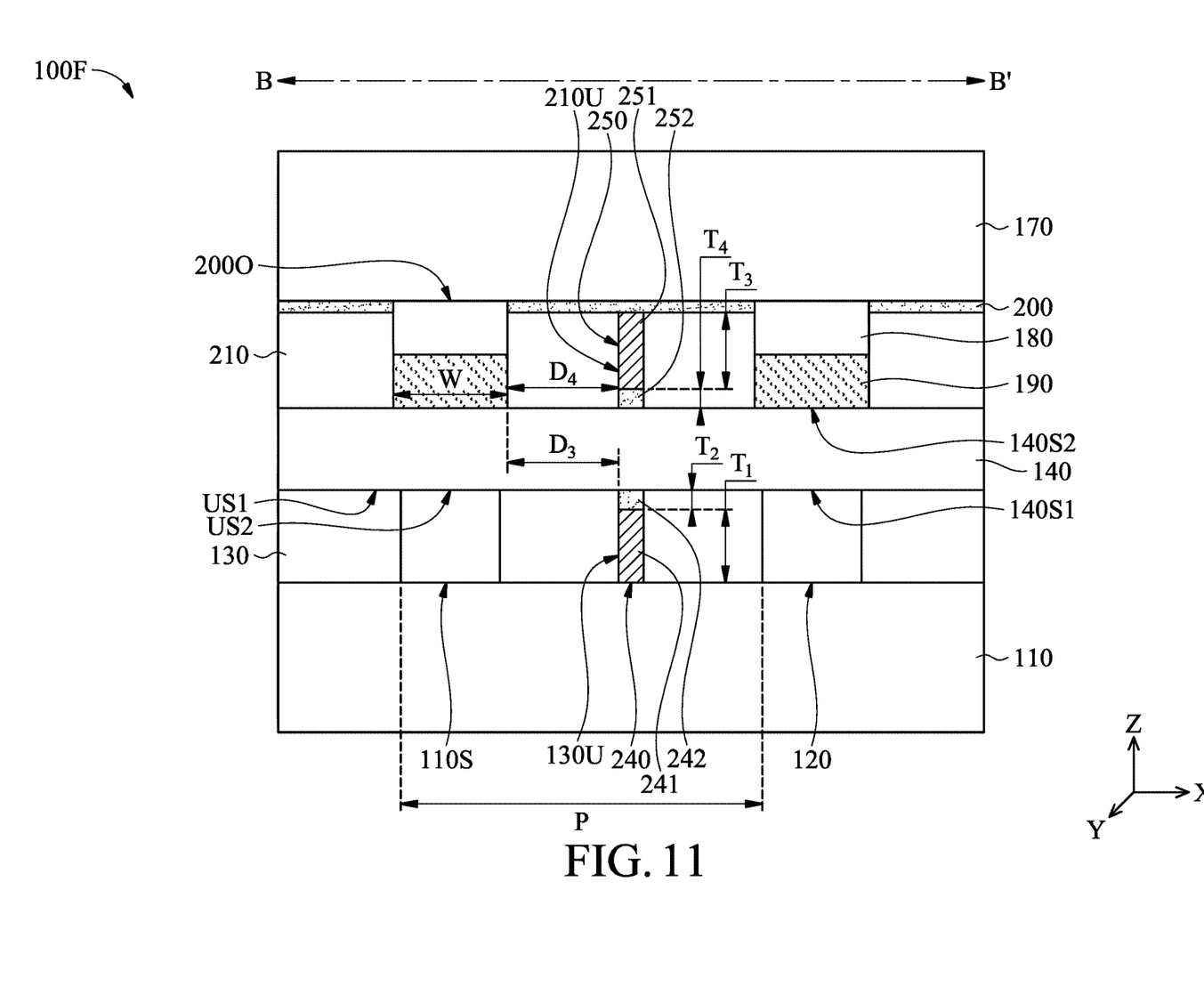
FIG. 11 illustrates a cross-sectional view of a semiconductor device in accordance with some embodiments of the present disclosure.

FIG. 11 illustrates a cross-sectional view of a semiconductor device 100F in accordance with some embodiments of the present disclosure. One of the differences between the semiconductor device 100F and the semiconductor device 100E is that the optical structure 220 and the optical structure 230 are replaced with an optical structure 240 and an optical structure 250, respectively. In some embodiments, the optical structure 240 and the optical structure 250 are disposed or filled in the first through hole 130U and the second through hole 210U, respectively. In some embodiments, the optical structure 240 may include a reflective layer 241 and an absorptive layer 242. In some embodiments, the absorptive layer 242 may be disposed on the reflective layer 241. Namely, the absorptive layer 242 is closer to the first side 140S1 of the adhesive structure 140 than the reflective layer 241. In some embodiments, the absorptive layer 242 may be in contact with the adhesive structure 140. In some embodiments, the reflective layer 241 may be disposed on the absorptive layer 242. Namely, the reflective layer 241 is closer to the first side 140S1 of the adhesive structure 140 than the absorptive layer 242. In some embodiments, the optical structure 250 may include a reflective layer 251 and an absorptive layer 252. In some embodiments, the absorptive layer 252 may be disposed between the reflective layer 251 and the adhesive structure 140. Namely, the absorptive layer 252 is closer to the adhesive structure 140 than the reflective layer 251. In some embodiments, the absorptive layer 252 may be in contact with the adhesive structure 140. In some embodiments, absorptive layer 252 may be disposed on the reflective layer 251. Namely, the reflective layer 251 is closer to the adhesive structure 140 than the absorptive layer 252. The reflective layer 241 and/or the reflective layer 251 may include, but is not limited to, metal, metal alloy, white reflective material, such as white ink, other suitable material or a combination thereof. The material of the absorptive layer 242 and/or the absorptive layer 252 may be the same as or similar to that of the optical structure 220, and is not repeated herein. The reflective layer 241 or the reflective layer 251 may be used to reflect light, emitted from the light-emitting diode 120 and incident to other light-emitting element (or pixel unit), to corresponding light conversion layer 190 and/or light filter layer 180, thereby improving the quality of light-emitting (or display) of the semiconductor device 100E. In addition, the color purity of the semiconductor device 100F is enhanced. The absorptive layer 242 or the absorptive layer 252 may be used to absorb light that is emitted from the light-emitting diode 120 and incident to other light-emitting unit (or pixel unit), thereby reducing interference between two adjacent light-emitting elements (or pixel unit). As a result, the quality of light-emitting (or display) or the color purity of the semiconductor device 100F is enhanced.

In some embodiments, one light conversion layer 190 and/or light filter layer 180 may overlap a plurality of light-emitting diodes 120 in the XY plane. These light-emitting diodes 120 may emit, but is not limited to, light of the same wavelength. In some embodiments, the semiconductor device 100F may not include the light conversion layer 190 or the light filter layer 180. In this case, these light-emitting diodes 120 may emit lights with different wavelengths or with different colors.

As shown in FIG. 11, the reflective layer 241 has the first thickness T1. The first thickness T1 may be defined as the maximum thickness of the reflective layer 241 in the Z direction. The absorptive layer 242 has the second thickness $T_2$. The second thickness $T_2$ may be defined as the maximum thickness of the absorptive layer 242 in the Z direction. In some embodiments, the first thickness $T_1$ may be greater than or equivalent to the second thickness $T_2$. In some embodiments, the first thickness $T_1$ may be less than or equivalent to the second thickness $T_2$. The reflective layer 251 has the third thickness $T_3$. The third thickness $T_3$ may be defined as the maximum thickness of the reflective layer 251 in the Z direction. The absorptive layer 252 has the fourth thickness $T_4$. The fourth thickness $T_4$ may be defined as the maximum thickness of the absorptive layer 252 in the Z direction. In some embodiments, the third thickness $T_3$ may be greater than or equivalent to the fourth thickness $T_4$. In some embodiments, the third thickness $T_3$ may be less than or equivalent to the fourth thickness $T_4$. The thickness of the element mentioned above may be measured by scanning electron microscope (SEM). For example, the SEM images of the elements or layers may be filmed, and the maximum thickness of the SEM image may be measured so as to define the thickness of the elements or layers mentioned above. The aforementioned maximum thickness may be a maximum thickness of any one of the cross-sectional plane. It should be appreciated that the width (such as W), the pitch (such as P), the distance (such as $D_1$, $D_2$, $D_3$ or $D_4$) of the elements may be filmed by optical microscopy (OM) to obtain the images. The width, the pitch and the distance of the elements in the images may be defined by measuring them or by other measuring methods. In addition, whether the first substrate 110 and the second substrate 170 are disassembled before optical filming or not may depend on the design of the semiconductor device. In some embodiments, if the semiconductor device includes the light shielding structure 200, which may affect the filming of the optical structure, the light shielding structure 200 may be removed by wet etching or dry etching before optical filming. However, the present disclosure is not limited thereto. In some embodiments, the cross-sectional structure may be filmed by SEM. For example, the cross-sectional structure of line A-A' of FIG. 1 and the cross-sectional structure of line B-B' of FIG. 8 may be observed by SEM so as to measure the width (such as W), the pitch (such as P), the distance (such as $D_1$, $D_2$, $D_3$ or $D_4$) of the elements mentioned above.

Although some embodiments of the present disclosure and their advantages have been described in detail, it should be understood that various changes, substitutions and alterations can be made herein by a person skilled in the art without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each one of the claims constitutes an individual embodiment; the scope of the present application also includes a combination of each claim and embodiment.

What is claimed is:

1. A semiconductor device, comprising:
   a first substrate;
   a first light-emitting diode disposed on the first substrate;
   a first insulating layer disposed on the first substrate and adjacent to the first light-emitting diode;
   an adhesive structure disposed on the first insulating layer, comprising:
   a first side facing the first light-emitting diode; and
   a second side opposite to the first side;
   a second substrate disposed on the adhesive structure;
   an optical structure in contact with at least one of the first side and the second side,
   a light conversion layer disposed between the second substrate and the second side of the adhesive structure; and
   a second insulating layer disposed on the second side of the adhesive structure and adjacent to the light conversion layer.

2. The semiconductor device as claimed in claim 1, wherein the optical structure comprises at least one of an absorptive material, a metal material and a metal oxide material.

3. The semiconductor device as claimed in claim 1, further comprising:
   a second light-emitting diode disposed on the first substrate, wherein the first insulating layer is disposed between the first light-emitting diode and the second light-emitting diode, the first insulating layer has a first through hole, and the optical structure is disposed in the first through hole.

4. The semiconductor device as claimed in claim 3, wherein the optical structure comprises a reflective layer and an absorptive layer, and the absorptive layer is disposed on the reflective layer.

5. The semiconductor device as claimed in claim 1, further comprising:
   a second light-emitting diode disposed on the first substrate, wherein the first insulating layer is disposed between the first light-emitting diode and the second light-emitting diode, the optical structure is in contact with the first side of the adhesive structure, a distance between the optical structure and the light conversion layer is D1, a pitch between the first light-emitting diode and the second light-emitting diode is P, a width of the light conversion layer is W, and the distance D1 fits the following relation:

$$0.5 \ \mu m \leq D1 \leq ((P-W)/2)-1 \ \mu m.$$

6. The semiconductor device as claimed in claim 1, further comprising:
   a second light-emitting diode disposed on the first substrate, wherein the first insulating layer is disposed between the first light-emitting diode and the second light-emitting diode, the optical structure is in contact with the second side of the adhesive structure, a distance between the optical structure and the light conversion layer is D2, a pitch between the first light-emitting diode and the second light-emitting diode is P, a width of the light conversion layer is W, and the distance D2 fits the following relation:

$$0.5 \ \mu m \leq D2 \leq ((P-W)/2)-1 \ \mu m.$$

7. The semiconductor device as claimed in claim 1, wherein the second insulating layer has a second through hole, and the optical structure is disposed in the second through hole.

8. The semiconductor device as claimed in claim 7, wherein the optical structure comprises a reflective layer and an absorptive layer, and the absorptive layer is disposed between the reflective layer and the adhesive structure.

9. A semiconductor device, comprising:
   a first substrate;
   a first light-emitting diode disposed on the first substrate;
   a first insulating layer disposed on the first substrate and adjacent to the first light-emitting diode;
   an adhesive structure disposed on the first insulating layer, comprising:

a first side facing the first light-emitting diode; and
a second side opposite to the first side;
a second substrate disposed on the adhesive structure;
an optical structure in contact with at least one of the first side and the second side; and
a light conversion layer disposed between the first light-emitting diode and the adhesive structure.

10. A method for manufacturing a semiconductor device, comprising:
providing a first substrate;
forming a first light-emitting diode on the first substrate;
forming a first insulating layer on the first substrate and adjacent to the first light-emitting diode;
forming an adhesive structure on the first insulating layer, wherein the adhesive structure comprises a first side facing the first light-emitting diode and a second side opposite to the first side;
forming a second substrate on the adhesive structure;
forming an optical structure in contact with at least one of the first side and the second side,
forming a light conversion layer between the second substrate and the second side of the adhesive structure; and
forming a second insulating layer on the second side of the adhesive structure and adjacent to the light conversion layer.

11. The method as claimed in claim 10, wherein the optical structure comprises at least one of an absorption material, a metal material and a metal oxide material.

12. The method as claimed in claim 10, further comprising:
forming a first through hole in the first insulating layer; and
forming a second light-emitting diode on the first substrate, wherein the first insulating layer is disposed between the first light-emitting diode and the second light-emitting diode, and the optical structure is disposed in the first through hole.

13. The method as claimed in claim 12, wherein the optical structure comprises a reflective layer and an absorptive layer, and the absorptive layer is disposed on the reflective layer.

14. The method as claimed in claim 10, further comprising:
forming a second light-emitting diode on the first substrate, wherein the first insulating layer is disposed between the first light-emitting diode and the second light-emitting diode, the optical structure is in contact with the first side of the adhesive structure, a distance between the optical structure and the light conversion layer is D1, a pitch between the first light-emitting diode and the second light-emitting diode is P, a width of the light conversion layer is W, and the distance D1 fits the following relation:

$$0.5\ \mu m \leq D1 \leq ((P-W)/2) - 1\ \mu m.$$

15. The method as claimed in claim 10, further comprising:
forming a second light-emitting diode disposed on the first substrate, wherein the first insulating layer is disposed between the first light-emitting diode and the second light-emitting diode, the optical structure is in contact with the second side of the adhesive structure, a distance between the optical structure and the light conversion layer is D2, a pitch between the first light-emitting diode and the second light-emitting diode is P, a width of the light conversion layer is W, and the distance D2 fits the following relation:

$$0.5\ \mu m \leq D2 \leq ((P-W)/2) - 1\ \mu m.$$

16. The method as claimed in claim 10, further comprising:
forming a second through hole in the second insulating layer, wherein the optical structure is disposed in the second through hole.

17. The method as claimed in claim 16, wherein the optical structure comprises a reflective layer and an absorptive layer, and the absorptive layer is disposed between the reflective layer and the adhesive structure.

* * * * *